United States Patent [19]

Nelson et al.

[11] Patent Number: 5,223,784
[45] Date of Patent: Jun. 29, 1993

[54] METHOD AND CIRCUIT FOR TRIGGERING AN ELECTRONIC INSTRUMENT ONLY ONCE DURING A PERIOD OF A SIGNAL

[75] Inventors: Theodore G. Nelson, Portland; Calvin D. Diller, Hillsboro; Robert D. Meadows, Portland, all of Oreg.

[73] Assignee: Tektronix, Inc., Wilsonville, Oreg.

[21] Appl. No.: 711,007

[22] Filed: Jun. 1, 1991

[51] Int. Cl.$^5$ .............................. H01J 29/70
[52] U.S. Cl. ........................ 324/121 R; 324/73.1; 364/487
[58] Field of Search ............... 324/115, 121 R, 99 D, 324/77 A, 102, 158 R, 73.1; 364/481, 487; 307/352, 351, 354, 362; 340/722

[56] References Cited

U.S. PATENT DOCUMENTS

| | | | |
|---|---|---|---|
| 3,798,467 | 3/1974 | Gottwald | 307/354 |
| 4,100,532 | 7/1978 | Farnbach | 382/1 |
| 4,399,512 | 8/1983 | Soma et al. | 324/121 R |
| 4,797,936 | 1/1989 | Nakatsugawa et al. | 324/121 R |
| 4,906,916 | 3/1990 | Koslar | 324/115 |

FOREIGN PATENT DOCUMENTS 0188565  10/1984  Japan ................. 324/102

*Primary Examiner*—Vinh Nguyen
*Attorney, Agent, or Firm*—Boulden G. Griffith; William A. Birdwell

[57] ABSTRACT

A method and circuit for triggering an electronic instrument only once during a period of an input signal having multiple triggering events during that period. A signal applied to an electronic instrument, such as an oscilloscope, is acquired. Qualified triggering events occurring on the acquired signal are identified. A selected one of the qualified triggering events during the period of the applied signal causes a trigger signal output to occur, while other qualified triggering events are ignored. In the preferred embodiment a triggering event is qualified by a first comparator that compares the input signal to a first reference level and produces a predetermined logic level output if the input signal bears a predetermined relationship to the reference level. When a qualified triggering event occurs, a buffer amplifier applies the predetermined logic level to charge a capacitor, which thereafter stores some energy from the input signal and applies it to a comparator for a predetermined period of time. The comparator compares the voltage on the capacitor to a second reference level and produces a pulse if the capacitor voltage has a predetermined relationship to the second reference level. The leading edge of the pulse comprises a trigger output signal. Subsequent triggering events which occur before a predetermined period of time are unable to produce another trigger signal. Five alternative embodiments employing the same general principle as the preferred embodiment are disclosed.

14 Claims, 4 Drawing Sheets

METHOD AND CIRCUIT FOR TRIGGERING AN ELECTRONIC INSTRUMENT ONLY ONCE DURING A PERIOD OF A SIGNAL

BACKGROUND OF THE INVENTION

This invention relates to methods and circuits for triggering electronic instruments, particularly triggering an oscilloscope to display a signal that has multiple potential triggering events during a period of that signal.

An oscilloscope ordinarily has a triggering circuit built into it that enables the user to view a stable graphic display of a repetitive input signal. A stable display is created by synchronizing the horizontal sweep with the signal that is to be displayed.

Triggering circuits in oscilloscopes typically compare the amplitude of the input signal to a user set amplitude (often referred to as the "trigger level") and start the horizontal sweep signal as soon as the input signal crosses the trigger level in a user selected direction. The reference amplitude often is adjusted so as to start the sweep at a unique point on the repetitive input waveform.

A problem is encountered when trying to use an oscilloscope to display the waveform of a signal that produces multiple triggering events during one sequence of the repetitive input signal. For example, large transients superimposed on a sine wave signal several times during the period of the sine wave may cause the oscilloscope to trigger several times during that period, thereby making it very difficult, if not impossible, to achieve synchronism.

AC and DC motors, and uninterruptable power supplies, often create signals that have multiple triggering events during a single period of the signal. For example, a variable frequency motor controller for an AC motor typically produces a set of sine weighted, pulse width modulated output signals used to drive the AC motor. Since each successive pulse could ordinarily produce a trigger, it is exceedingly difficult to synchronize the oscilloscope sweep signal to the motor controller output waveform.

Another example of multiple triggering events in a single period of a signal can be found in DC motor drive circuits, which produce transient signals on the power line feeding the drive circuit. This happens because the impedance seen by the power line changes when a thyristor turns on to pass power to the motor at some point during each half-cycle. Such transients often propagate to other electrical systems connected to the same power line, such as computer systems, and there produce performance problems. Since the transients ordinarily occur at least twice during one period of the 60 Hz power supply, it is exceedingly difficult to synchronize an oscilloscope to the power line for diagnosing the source of problems for such systems.

Therefore, it can be seen that there is a need for an effective method and circuit for triggering an electronic instrument, such as an oscilloscope, only once during a single period of a signal having multiple triggering events during that period.

SUMMARY OF THE INVENTION

The present invention provides a method and circuit for performing signal processing on an input signal to an electronic instrument to create a trigger signal. The trigger signal responds to only a selected triggering event that occurs during one period of the input signal and is thereafter disabled until no triggerable events occur for a specified time period. The invention compares the input signal level to a reference level to qualify portions of the signal as potential triggering events using a qualifying circuit. A qualified signal is applied to a discrimination circuit which discriminates between a selected triggering event and other potential triggering events to produce a trigger output.

In the preferred embodiment the qualifying circuit comprises a first comparator which produces a high signal for the duration of a qualifying event and a low signal otherwise. The discriminator circuit employs a resistor capacitor storage element, a second comparator and a transistor current amplifier. The amplifier comprises an emitter follower having a resistor between the emitter of the transistor and the negative supply voltage or to ground. The emitter is also connected to the input of the comparator, and a capacitor is connected in parallel with the resistor from the emitter to the negative supply voltage or to ground. Preferably, the input to the transistor amplifier is acquired from the output of a conventional trigger circuit that includes a first comparator and thereby provides the qualifying circuit. The output of the emitter follower is applied both to the second comparator, which produces a trigger signal output when the amplitude of its input signal is high enough, and to the capacitor, which charges rapidly when the amplifier is turned on but stores energy and discharges slowly when the amplifier is thereafter turned off. The stored energy maintains a positive voltage on the capacitor, which prevents the comparator from making a new comparison for a selected period of time, typically slightly less than one-half the period of the input signal. This prevents any triggering events occurring during that time from producing a trigger signal.

Therefore, it is a principal objective of the present invention to provide a novel method and circuit for triggering an electronic instrument only once during an input signal period for an input signal having multiple triggering events occurring during that period.

It is another objective of the present invention to provide a triggering method and circuit that will enable the horizontal sweep of an oscilloscope to be synchronized with an input signal having multiple triggering events occurring during a single period of that signal.

It is another objective of the present invention to provide a triggering method and circuit that qualifies events in an input signal as potential triggering events and thereafter discriminates among them to create a trigger signal.

It is a further objective of the present invention to provide a triggering method and circuit that will enable an electronic instrument to trigger only once during the period of an AC electric motor controller output signal.

It is yet another objective of the present invention to provide a triggering method and circuit that will enable an electronic instrument to trigger only once during the period of an AC power supply for a DC motor drive that produces multiple transients in the power supply.

The foregoing and other objectives, features, and advantages of the invention will be more readily understood upon consideration of the following detailed description of the invention, taken in conjunction with the accompanying drawings.

DETAILED DESCRIPTION OF THE INVENTION

Figure 1:
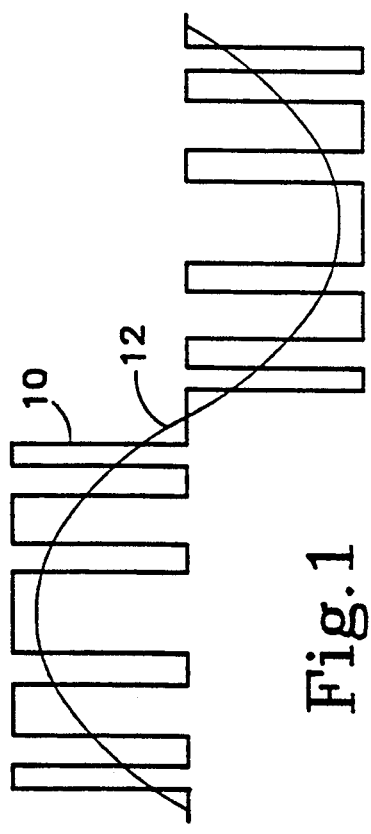
FIG. 1 is a waveform representing a sine weighted, pulse width modulated output of an AC motor controller, with a sine wave superimposed thereon.

One period of one phase of a typical AC motor controller output signal 10 is shown in FIG. 1. As shown by the waveform, the signal is pulse width modulated to create a sine wave weighted waveform. One period of the equivalent sine waveform 12 is superimposed over the pulse waveform in order to illustrate the weighting.

It can be seen that during just the first, positive portion of the motor controller output signal there are five sharp rises (and five corresponding falls), each of which is ordinarily a triggering event. An ordinary trigger circuit would trigger on each successive pulse, thereby making it impossible to synchronize the horizontal sweep of an oscilloscope so as to display the entire waveform.

Figure 2:
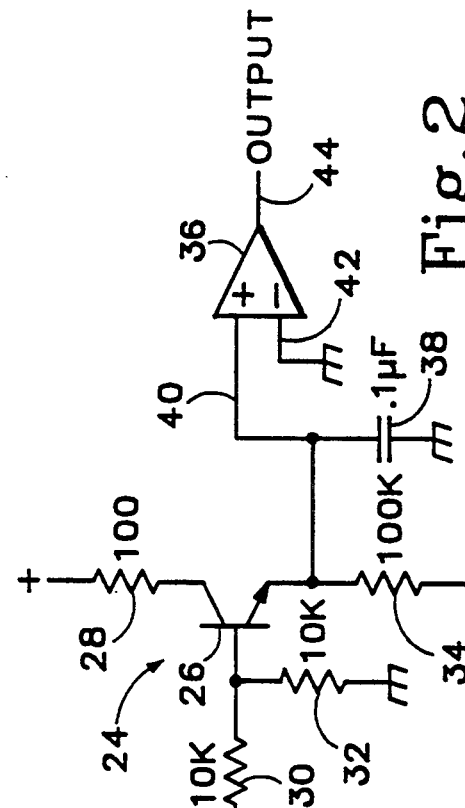
FIG. 2 is a schematic diagram of a preferred embodiment according to the present invention, including a conventional trigger circuit.

Turning to FIG. 2, which shows the preferred embodiment of the invention, comparator 14 represents a conventional trigger circuit for an oscilloscope. The signal to be displayed is connected to input 16 of the comparator 14 and compared to a reference level provided to input 18. When the applied signal amplitude is higher than the reference level, which is typically adjustable, the comparator produces a high output at point 20, provided that a predetermined slope condition is met. This qualifies the applied signal at that time as a triggering event. A signal applied to slope input 22 determines whether the output is to be triggered on a positive-going slope or on a negative-going slope.

The remainder of the circuit shown in FIG. 2 represents the discrimination circuit. It employs an emitter-follower buffer amplifier 24, having NPN transistor 26 (such as a 2N2222), collector resistor 28, input resistor 30, bias resistor 32, and emitter resistor 34. It also employs a comparator 36 and a capacitor 38.

Transistor 26 primarily acts like a buffer amplifier. It is biased by resistor 32 so that, in the absence of an input signal at point 20, the voltage at the emitter of the transistor is initially negative. Consequently, the voltage applied to the noninverting input 40 of comparator 36 is also negative. When an output signal is produced at point 20 by the conventional trigger circuit, it applies a current to the base, and consequently more current flows from the collector to the emitter of the transistor. That causes the emitter voltage to rise to approximately the voltage applied to the base, which is a positive voltage. Since the transistor 26 and resistor 28 present relatively low effective resistance to the capacitor 38, the capacitor is charged to that positive voltage rapidly, in comparison to the period of the input signal. That presents a positive voltage to input 40 of comparator 36, which compares that positive voltage to a reference level at input 42. The reference level at input 42 of the comparator 36 in the preferred embodiment is ground, but in concept it could be some other level. When input 40 of comparator 36 is positive with respect to input 42, a high trigger signal output is produced at comparator output 44. More specifically, the output signal at 44 is a pulse of varying duration,.depending on the input signal, and the leading edge of that output signal is the trigger signal and is synchronized with the first triggering event.

When the signal at point 20 terminates, leaving point 20 at ground potential, the base of transistor 26 drops to ground, provided that capacitor 38 is still substantially charged. Resistor 34 now presents a relatively high resistance to capacitor 38, so that the discharge time constant of the resistor capacitor pair (typically about 8 msec) is relatively long in comparison to the duration of triggering events. Preferably it is a little less than one-half the input signal period. Consequently, the base-emitter junction of the transistor is reverse biased so that the transistor turns off. Input 40 to comparator 36 remains positive with respect to input 42, and the trigger signal output remains high until the capacitor 38 is substantially discharged.

Figure 3:
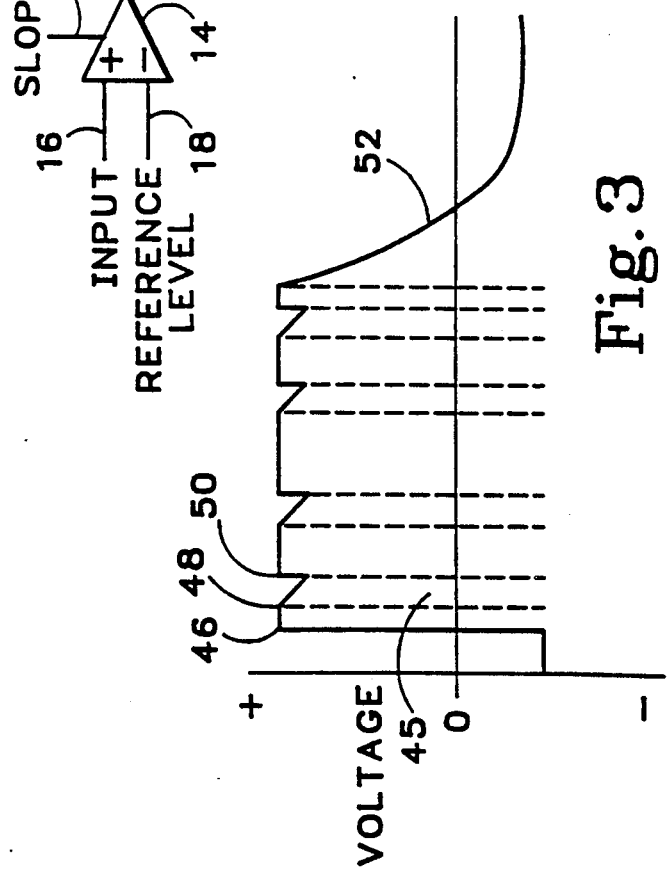
FIG. 3 is a waveform representing the trigger signal output of the circuit of FIG. 2 in response to the output signal of an AC motor controller having a pulse waveform as shown in FIG. 1.

When another triggering event occurs at input 16 of comparator 14 so as to produce a new signal at point 20 before capacitor 38 has substantially discharged from the previous event, transistor 26 turns on and the capacitor is recharged to very nearly the voltage applied to the base of the transistor. Since the comparator 36 has not yet turned off, no new trigger output signal is produced at output 44. This can be seen in FIG. 3, which shows the voltage across capacitor 38 as a result of the signal shown in FIG. 1. The dashed lines 45 in FIG. 3 show the pulse pattern of FIG. 1. At point 46, the first pulse in FIG. 1 occurs. At point 48, the first pulse terminates. At point 50, the second pulse occurs. The capacitor discharges from point 48 to point 50, then rapidly recharges at point 50. When the last positive pulse terminates, the capacitor is allowed to substantially discharge, as shown at 52, and the base-emitter junction of transistor 26 becomes forward biased again. Thereafter, a new triggering event will cause comparator 36 to produce another trigger signal output. Thence, while the circuit produces a trigger signal output in response to the first triggering event during the period of the motor controller signal output, it prevents production of a trigger signal for subsequent triggering events during that period.

Figure 4:
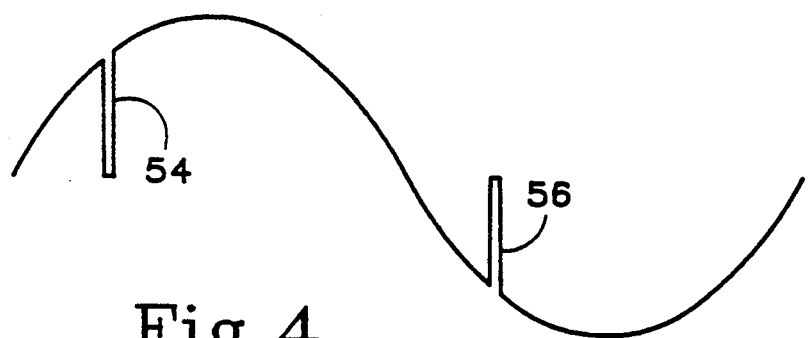
FIG. 4 is a waveform representative of an AC power supply having a DC motor drive circuit connected thereto.

FIG. 4 shows a typical 60 Hz power supply waveform to which a DC motor drive circuit has been attached. The DC motor drive circuit places a heavy load on the power supply briefly when it turns on power to the motor twice during the period of the power supply. This results in the transients 54 and 56, which could be triggering events. An ordinary oscilloscope trigger circuit would produce a trigger signal for each of these events, thereby making it difficult to display an entire power signal period. However, the circuit and method of this invention produce a trigger signal only on the rise or fall, selectively, of the first threshold crossing (the rising or falling portion of the sinusoidal wave), thereby permitting the horizontal sweep of an oscilloscope to be synchronized with the 60 hz line signal.

An uninterruptable power supply would internally typically produce a waveform similar to that of the AC motor drive. This signal is passed through a low pass filter, normally an inductor, to create a simulated AC power signal and applied to the circuit of the present invention which would respond in a similar way as it would to a AC motor drive.

While the emitter follower amplifier 24 is the preferred buffer between the input signal and the capacitor, a diode could also be used in place of the base-emitter junction of transistor 26, thereby preferred embodiment may be used as well without departing from the principles of the invention.

Figure 5:
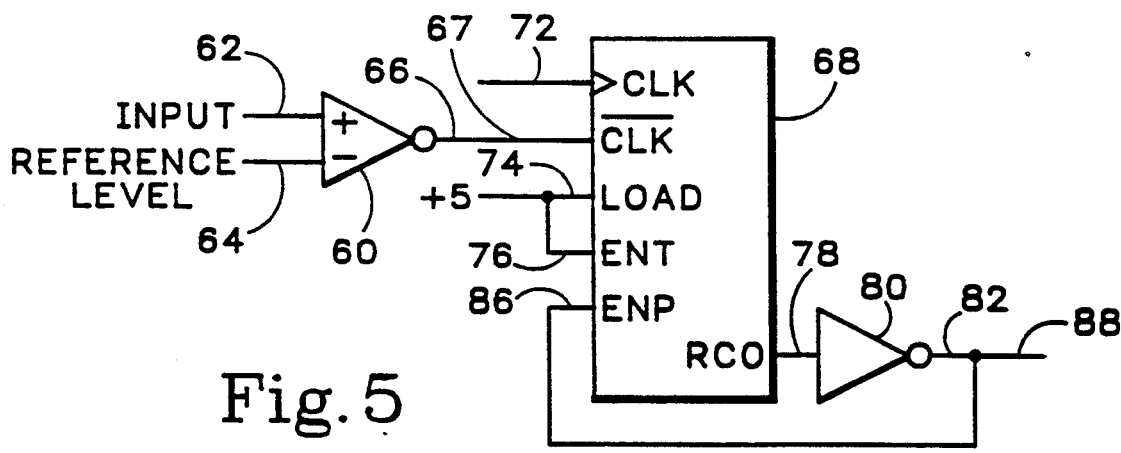
FIG. 5 is an schematic diagram of a first alternative embodiment according to the principles of the present invention.

A first alternative embodiment of the invention is shown in FIG. 5. It is similar to the preferred embodiment in that it employs a time delay to discriminate between a selected trigger event and other, subsequent trigger events.

In FIG. 5, triggering events in the input signal are qualified as such by comparator 60. This is done by applying the signal to be tested to the noninverting input 62 of the comparator 60 and applying a reference level to inverting input 64, so that whenever the amplitude of the signal to be tested exceeds the reference level the comparator 60 produces a logic signal at comparator output 66. Since the output of comparator 60 is inverted, the presence of a qualified event is represented by a low logic level, while the absence of a qualified triggering event is represented by a high logic level. Of course, the circuit could be built to achieve the opposite result without departing from the principles of the invention.

The output 66 of the comparator 60 is applied to the not clear ($\overline{CLR}$) input 67 of a counter 68 (such as a 74LS163). A clock signal is applied to the clock (CLK) input 72 of the counter, and a high logic level signal is applied to the load (LOAD) input 74 and the enable T (ENT) input 76. The ripple carry out (RCO) 78 of the counter is applied to an inverter 80, whose output 82 is applied to the enable P (ENP) input 86 of the counter 60. It also provides trigger signal ouput 88.

In operation, a qualified low signal to the $\overline{CLR}$ input 67 of the counter 68 causes the counter to reset to zero and start counting, in response to the clock, up to fifteen, as is commonly understood in the art. If the counter is not counting and the $\overline{CLR}$ input is driven low, the circuit output 88 is driven high, which comprises a trigger signal. At the count of fifteen, which represents a predetermined period of time, e.g., eight milliseconds, a high logic level is produced at the RCO output 78. The inverter 80 converts that to a low logic level, which terminates the trigger output signal at output 88. It also causes the counter to stop counting by applying a low logic level to the ENP input 86 of the counter. However, no qualified event which occurs before the counter has completed its count to fifteen, that is, within eight milliseconds of the last event, will cause a new trigger output signal to occur. Indeed, such an event will cause the counter to start its count over again.

Figure 6:
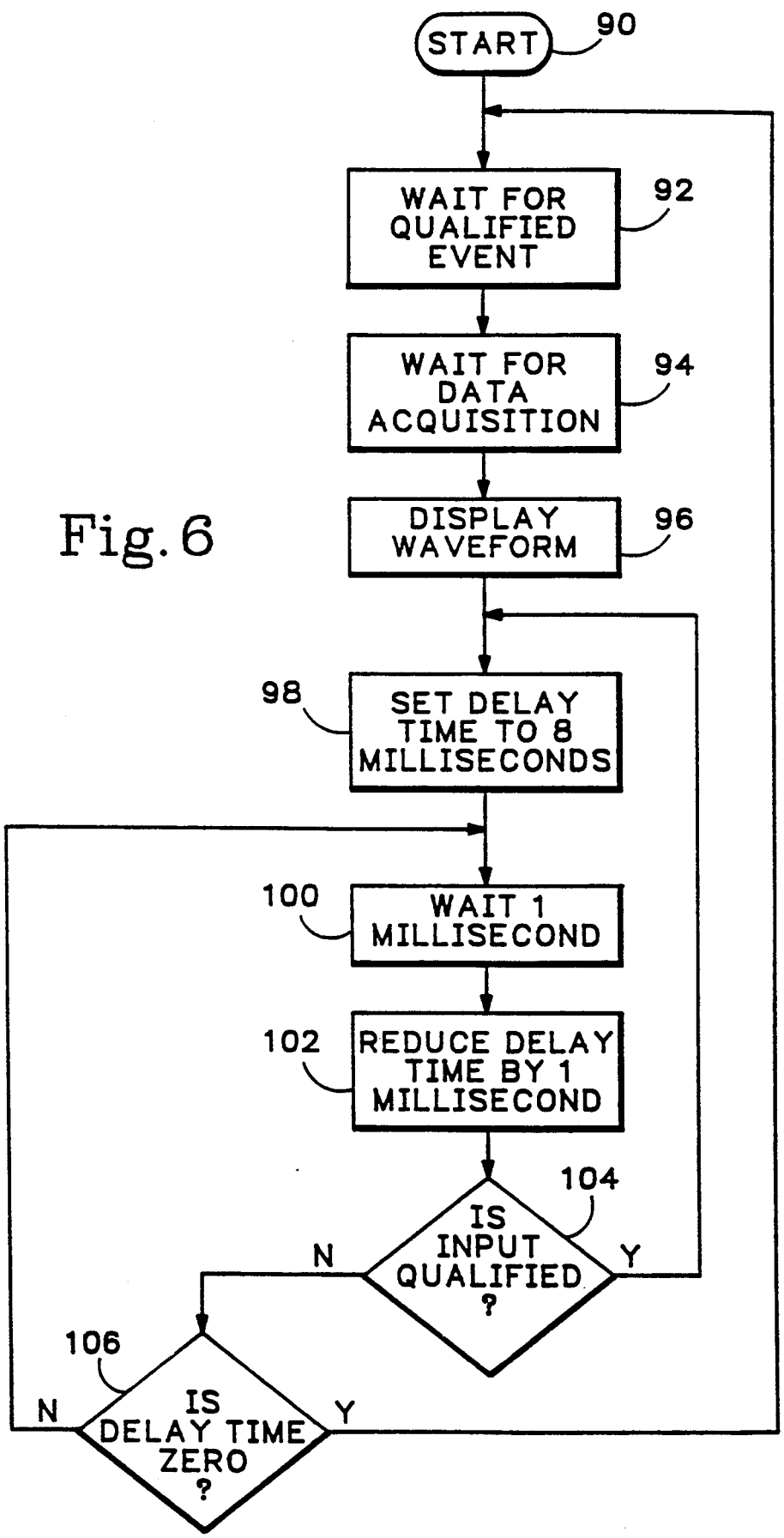
FIG. 6 is a flow chart for a computer program that implements a second alternative embodiment according to the principles of the present invention.

A second alternative embodiment is shown in FIG. 6. This embodiment is related to the aforedescribed first alternative embodiment, except that it is implemented by a programmed computer processor, preferably a microprocessor (not shown), as is commonly understood in the art. This embodiment would ordinarily, but not necessarily, be used in a digital oscilloscope. What is shown is a flow chart for a computer program. In the flow chart, the program starts at circle 90 then, in step 92, waits for a high logic level from a comparator (not shown) such as comparator 60 in the first alternative embodiment, thereby indicating the presence of a qualified triggering event. Once an event has qualified, the program takes over.

After a qualified event is recognized, in step 94 the program waits for all the data representing the waveform to be acquired. Then, in step 96, it displays the waveform. Once the waveform is displayed the program sets a delay time counter to eight milliseconds in step 98. Next, in step 100, the program waits one millisecond and, in step 102, thereafter reduces the delay time counter by one millisecond.

If, during a delay of one millisecond, the input is qualified by the comparator, as determined in step 104, the program repeats step 98 to reset the delay time counter and then repeats steps 100, 102 and 104. On the other hand, if the input has not been qualified, the program determines in step 106 whether the delay time is zero, that is, whether the delay time counter has been decremented eight milliseconds. If so, the program returns to step 92 and waits for a qualified signal. If not, the program repeats steps 100, 102, 104 and, possibly, 106 until the delay time reaches zero. Thence, no new waveform data will be acquired and displayed until eight milliseconds has passed following the last qualified event.

Figure 7:
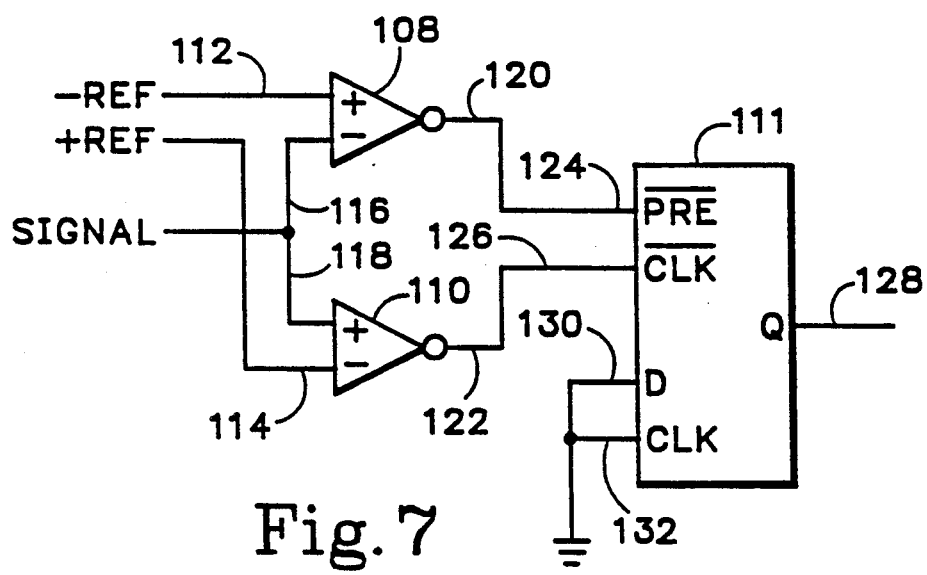
FIG. 7 is an schematic diagram of a third alternative embodiment according to the principles of the present invention.

A third alternative embodiment of the invention is shown in FIG. 7. In this case, the qualification of triggering events is accomplished by a pair of comparators 108 and 110. The discrimination between those events is accomplished by a dual D flip flop 111 (such as a 74LS163), having a not clear ($\overline{CLR}$) input 124 and not preset ($\overline{PRE}$) input 126, based on the state of the input signals.

A negative reference level is applied to the noninverting input 112 of comparator 108, and a positive reference level is applied to the inverting input of comparator 110. The input signal to be displayed is applied to the inverting input 116 of comparator 108 and to the noninverting input 118 of comparator 110. When the voltage of the input signal exceeds the voltage of the negative reference level, the comparator 108, which has an inverted output 120 and produces a high logic level with a quiescent signal input, produces a high logic level. The comparator 110, which has an inverted output 122 and produces a high logic level with a quiescent signal input, produces a low logic level. The high logic level produced by the comparator 108 and applied to the not preset ($\overline{PRE}$) input 124 of the flip flop 111 causes the Q output 128 of the flip flop to go to a high logic level, which provides the desired trigger signal output.

When the voltage of the input signal exceeds the voltage of the positive reference signal, the comparator 110 produces a high logic level which is applied to the not clear ($\overline{CLR}$) input 126 of the flip flop. This prevents the flip flop from clearing until the input signal voltage is less than the positive reference signal. When that occurs, the Q output drops to a low logic level and the circuit is ready to issue another trigger signal. Thence, the circuit will only produce a trigger signal on the first positive going event during the input signal period.

The D input 130 and the clock (CLK) input 132 of the flip flop are held at ground and have no affect on the output.

Figure 8:
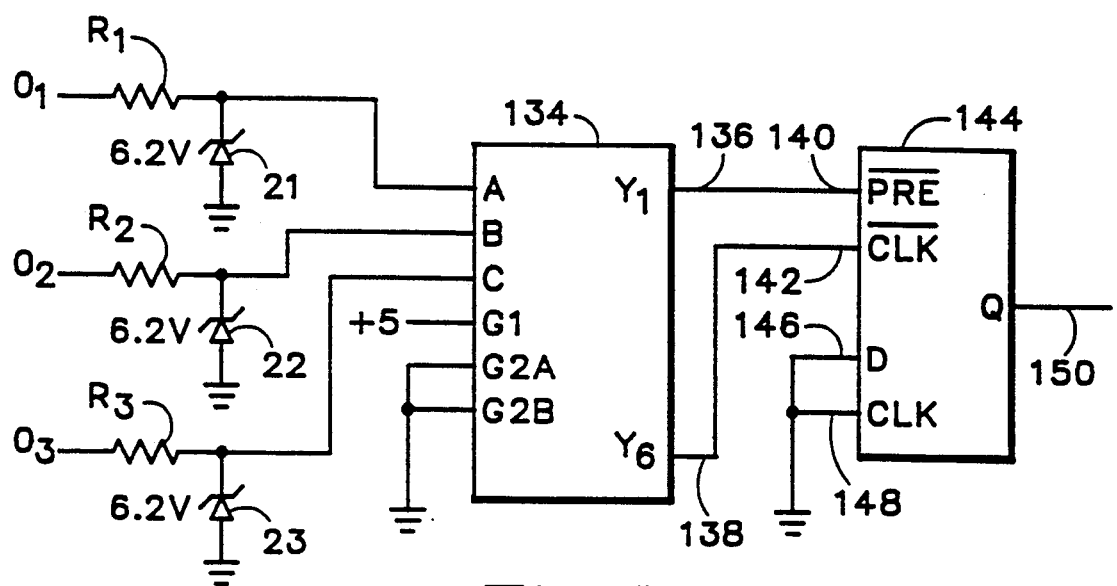
FIG. 8 is an schematic diagram of a fourth alternative embodiment according to the principles of the present invention.

A fourth alternative embodiment of the invention is shown in FIG. 8. It is similar to the third alternative embodiment in that it produces a trigger signal based on the state of the input signals. However, it is adapted to a three phase power source. Each phase of an Ac motor controller power source, that is $\phi1$, $\phi2$ and $\phi3$, is applied through respective resistors R1, R2 and R3 to respective zener diodes Z1, Z2 and Z3. Consequently, no phase signal can, at its zener diode, exceed the reverse bias zener voltage, e.g., 6.2 volts, and none can go lower than the forward bias diode voltage, e.g., 0.6 volts, and thereby qualified as triggering events. This produces three signals represent logic levels, and thereby qualified as triggering events. The three signals produced at the zener diodes are applied to the A, B and C inputs of a three-to-eight decoder 134, i.e., a binary to octal converter. The "1" count output 136 and "6" count output 138 of the decoder 134 are applied to the not preset ($\overline{PRE}$) input 140 and not clear ($\overline{CLR}$) input 142 of a dual D flip flop 144. The D input 146 and clock (CLK) input 148 of the flip flop are tied to ground and do not affect the Q output 150. The Q output produces the trigger signal output.

In the operation of a three phase AC motor by a typical motor controller, as is commonly known in the art, one of six state combinations is applied to the motor. That is, power is switched to the three motor winding inputs A, B and C in one of six combinations: 001, 011, 010, 110, 100, and 101, where each number position represents a positive voltage ("1") or a negative voltage ("0") applied to applied to the windings A, B or C, respectively. The combinations 111 and 000 are not used because applying the same voltage to all three windings accomplishes nothing.

Figure 9:
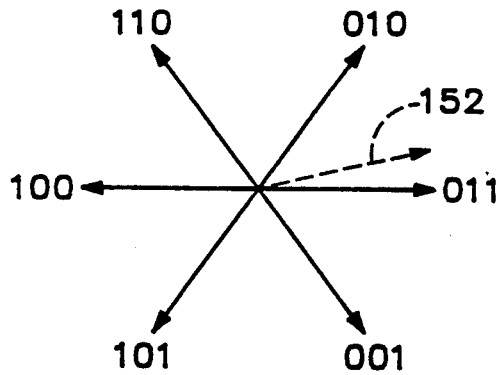
FIG. 9 is a vector diagram of the fields produced in a three phase AC motor showing how those fields are affected by a motor controller of the type for which the trigger circuit of the embodiment of FIG. 8 is adapted.

FIG. 9 shows the effect of the six possible power state combinations applied to a three phase motor. The six solid vectors indicate the directions of the field produced by the motor windings, and thence the direction the motor rotor should align itself, in response to the respectively identified state combinations. To produce a direction in between, as illustrated by the dashed vector 152, the controller must jump back and forth between two adjacent state combinations. The direction will be most nearly the same as the state combination on which the controller spends the most time. In this manner, the controller causes the motor to rotate smoothly a full 360 degrees.

Returning to FIG. 8, a trigger signal output for viewing the power applied to any one of the motor windings can be obtained by setting the trigger signal output high when the motor is driven with one state combination, then resetting the trigger signal output when the motor is driven by another, non-adjacent state combination during the same revolution of the motor, preferably the opposite state combination, e.g., 001, then 110. (Adjacent state combinations cannot be used because the controller jumps back and forth between them, which make synchronism impossible.) As shown by FIG. 9, the second state combination 001 and the sixth state combination 110 are opposite one another. When the 001 state combination occurs the Y1 output of the decoder 134 goes high, so the Q output of flip flop 150 goes high, producing a trigger signal output. When the 110 state combination occurs, the Y6 output of the decoder goes high, so the trigger signal is terminated.

Figure 10:
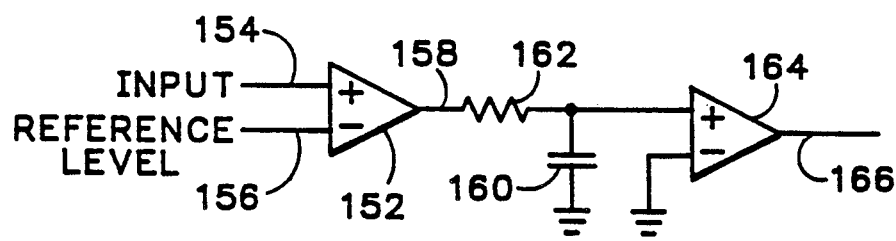
FIG. 10 is an schematic diagram of a fifth alternative embodiment according to the principles of the present invention.

A fifth alternative embodiment is shown in FIG. 10. In this case, qualification of a portion of the applied signal as being a triggering event is also accomplished by a comparator 152. The applied signal is connected to the input 154 of the comparator and is compared to a reference level applied to a reference input 156. When the applied signal exceeds the reference level the comparator produces a high logic level at its output 158, and when the applied signal dips below the reference level, the output produces a low logic level.

The qualified events, in the form of rectangular wave outputs at 158 from the comparator 152 are discriminated by a low pass filter comprising capacitor 160 and resistor 162, and a second comparator 164. The low pass filter reduces a sine-weighted pulse-width modulated signal to its fundamental frequency, that is, the equivalent sine waveform. The comparator 164 then turns on during the positive half of that waveform, producing a high logic level trigger signal at its output 166, and turns off when the waveform becomes negative. Thence, this alternative embodiment produces a trigger signal based on the duty cycle of the fundamental frequency of the pulse train.

The terms and expressions which have been employed in the foregoing specification are used therein as terms of description and not of limitation, and there is no intention in the use of such terms and expressions of excluding equivalents of the features shown and described or portions thereof, it being recognized that the scope of the invention is defined and limited only by the claims which follow.

I claim:

1. A trigger circuit for triggering an electronic instrument only once during a period of an input signal having multiple triggering events during said period, comprising:

qualifier means for qualifying multiple events occurring during said period of said input signal as being triggering events by producing a preliminary trigger signal in response to each of said events;

timing means for producing and maintaining a held trigger signal for a predetermined interval in response to a preliminary trigger signal, the predetermined interval restarting in response to additional preliminary trigger signals received before the predetermined interval has expired; and trigger generation means for producing the output trigger signal in response to the held trigger signal.

2. The trigger circuit of claim 1, wherein said input signal is provided by an AC motor controller.

3. The trigger circuit of claim 1, wherein said input signal is provided by the power supply input to a DC motor drive.

4. The trigger circuit of claim 1, wherein said input signal is provided by a power output of an uninterruptable power supply.

5. The trigger circuit of claim 1 wherein the timing means comprises:

a resistor-capacitor network for maintaining the held signal for the duration of a time constant corresponding to the predetermined interval; and means for initializing the resistor-capacitor network in response to preliminary trigger signals.

6. The trigger circuit of claim 1 wherein the timing means comprises a counter programmed to count for the predetermined interval and configured to restart counting in response to preliminary trigger signals.

7. The trigger circuit of claim 1 wherein the timing means comprises a microprocessor programmed to wait for the predetermined interval following each preliminary trigger signal, the microprocessor having access to timekeeping resources.

8. The trigger circuit of either of claims 1 or 2 wherein said trigger generation means comprises comparator means for producing the output trigger signal when the held trigger signal is above a reference level.

9. The trigger circuit of claim 1 in which the predetermined interval is slightly less than one half of the period of the input signal.

10. A method for triggering an electronic instrument only once during a period of an input signal having multiple qualifying triggering events per period, the method comprising the steps of:

generating preliminary trigger signals upon each occurrence of a qualifying triggering event;

starting or restarting a time interval upon each occurrence of the preliminary trigger signal; and producing an output trigger signal when a preliminary trigger signal occurs while the time interval has expired.

11. A method according to claim 10 in which the generating step comprises the step of comparing the input signal to a threshold.

12. A method according to claim 10 in which the time interval is slightly less than one half of the period of the input signal.

13. A method according to claim 10 in which the starting or restarting step comprises the steps of:

rapidly charging a capacitor upon each occurrence of the preliminary trigger signal;

discharging the capacitor relatively slowly over the time interval to a voltage level that is below a threshold; and generating an output trigger signal each time the capacitor is rapidly charged from a voltage level that is below the threshold.

14. A method according to claim 10 in which the starting or restarting step comprises the step of starting or restarting a counter each time the preliminary trigger signal occurs.

* * * * *